United States Patent [19]

Terashima

[11] Patent Number: 5,497,011

[45] Date of Patent: Mar. 5, 1996

[54] SEMICONDUCTOR MEMORY DEVICE AND A METHOD OF USING THE SAME

[75] Inventor: Tomohide Terashima, Hyogo, Japan

[73] Assignee: Mitsubishi Denki Kabushiki Kaisha, Tokyo, Japan

[21] Appl. No.: 459,219

[22] Filed: Jun. 2, 1995

[30] Foreign Application Priority Data

Sep. 19, 1994 [JP] Japan .................................. 6-222991

[51] Int. Cl.$^6$ .................................................. H01L 29/74
[52] U.S. Cl. .......................... 257/147; 257/133; 257/139; 257/140; 257/141
[58] Field of Search ...................... 257/147, 133, 257/139, 140, 141, 146

[56] References Cited

U.S. PATENT DOCUMENTS 5,091,766  2/1992  Terashima ................................ 257/138
5,155,569  10/1992  Terashima ................................ 257/138

*Primary Examiner*—Mark V. Prenty
*Attorney, Agent, or Firm*—Lowe, Price, LeBlanc & Becker

[57] ABSTRACT

In this semiconductor device, first, fifth and fourth impurity regions of a second conductivity type are formed on a main surface of a semiconductor layer of a first conductivity type with a predetermined space between each other. Second and third impurity regions of the first conductivity type are formed on the main surface of the first impurity region with a predetermined space between each other. A second gate electrode is formed between the second and third impurity regions. A first gate electrode is formed between the third impurity region and the semiconductor layer. A cathode electrode is connected to the third impurity region, and a short-circuit electrode is connected to first and second impurity regions. The first and fifth impurity regions are electrically short-circuited. Thereby, in the on state of the thyristor operation, the transistor including the second gate electrode can be off, whereby an entire hole current in the semiconductor layer forms a base current of one of the bipolar transistors, resulting in reduction of the holding current. Since the second gate electrode is provided independently from the first gate electrode, the gate length of the second gate electrode can be reduced, so that the on-resistance can be reduced, and thus the maximum controllable current can be increased.

12 Claims, 9 Drawing Sheets

SEMICONDUCTOR MEMORY DEVICE AND A METHOD OF USING THE SAME

BACKGROUND OF THE INVENTION

1. Field of the Invention

The present invention relates to a semiconductor device and a method of using the same, and in particular to a semiconductor device used in a breakdown-resistive integrated circuit or a power integrated circuit as well as a method of using the same.

2. Description of the Background Art

FIG. 13 is a cross section showing an output element used in a breakdown-resistive IC (Integrated Circuit) or a power IC in the prior art. FIG. 14 is an equivalent circuit diagram of the element shown in FIG. 13. Referring to FIG. 13, the conventional output element used in the breakdown-resistive IC or power IC, an insulating film 3 is formed on a main surface of a semiconductor substrate 1. An $n^-$-SOI (Silicon On Insulator) layer 2 is formed on insulating film 3. At the main surface of $n^-$-SOI layer 2, there are formed p-diffusion regions 4, 6 and 5 with a predetermined space between each other. An $n^+$-diffusion region 7 is formed at the main surface of p-diffusion region 4. A gate electrode 11 is formed on the main surface of $n^-$-SOI layer 2 located between p-diffusion regions 4 and 6 with an insulating film 9 therebetween.

An insulating film 20 is formed on $n^-$-SOI layer 2, and contact holes are formed at predetermined regions in insulating film 20. There is formed a cathode electrode 13 having a portion located in the contact hole of insulating layer 20 and being in contact with the main surface of $n^+$-diffusion region 7. There is also formed an electrode 21 having a portion located in the contact hole of insulating layer 20 and being in contact with the main surface of p-diffusion region 6. There is further formed an anode electrode 15 having a portion located in the contact hole of insulating layer 20 and being in contact with the main surface of p-diffusion region 5. Cathode electrode 13 and electrode 21 are electrically connected together via a resistance 17. An electrode 14 is formed on a rear surface of semiconductor substrate 1.

Referring to FIGS. 13 and 14, there is formed an npn bipolar transistor, in which $n^+$-diffusion region 7 forms an emitter, p-diffusion region 4 forms a base and $n^-$-SOI layer 2 forms a collector. There is also formed a pnp bipolar transistor of a multi-collector type, in which p-diffusion region 5 forms an emitter, $n^-$-SOI layer 2 forms a base and p-diffusion regions 4 and 6 form collectors. In this pnp bipolar transistor including two collectors, the collector (p-diffusion region 6) nearer to the emitter, i.e., p-diffusion region 5 has a larger base transport factor α than the other.

There is further provided an MOS11 formed of an n-channel MOS transistor, in which $n^+$-diffusion region 7 forms a source region, p-diffusion region 4 forms a back gate and $n^-$-SOI layer 2 forms a drain region. There is also provided an MOS12 formed of a p-channel MOS transistor 12, in which p-diffusion region 6 forms a source region, $n^-$-SOI layer 2 forms a back gate and p-diffusion region 4 forms a drain region.

Referring to FIGS. 15–17, operation of the conventional semiconductor device shown in FIG. 13 will be described below. First, 0 V is applied to cathode electrode 13 and electrode 14, $-Vg$ is applied to gate electrode 11 and $+Vd$ is applied to anode electrode 15. Thereby, as shown in FIG. 15, a surface portion of $n^-$-SOI layer 2 located under gate electrode 11 is inverted into the p-type. This results in short-circuit between p-diffusion region 4 and $n^+$-diffusion region 7, so that this output element is turned off.

In this state, as shown in FIG. 16, the voltage applied to gate electrode 11 is changed into $+Vg$. Thereby, the surface of p-diffusion region 4 is inverted into the n-type, so that an electron current flows from $n^+$-diffusion region 7 into $n^-$-SOI layer 2. As the electron current flows into p-diffusion region 5, a hole current flows from p-diffusion region 5 into $n^-$-SOI layer 2. This hole current forms a base current of the npn bipolar transistor, resulting in thyristor operation.

In order to turn off the thyristor operation described in connection with FIG. 16, the voltage applied to gate electrode 11 is set to $-Vg$ again as shown in FIG. 17. Thereby, the surface of $n^-$-SOI layer 2 under gate electrode 11 is inverted into the p-type, so that the hole current flowed into p-diffusion region 4 flows into p-diffusion region 6. At the same time, the hole current in $n^-$-SOI layer 2 is pulled out via p-diffusion region 6, so that the base current of npn bipolar transistor decreases. Thereby, the thyristor operation is turned off.

In the conventional semiconductor device shown in FIG. 13, if the resistance 17 has a large resistance value, only a reduced amount of hole current flows from p-diffusion region 4 into p-diffusion region 6 during the turning off shown in FIG. 17, which results in such a disadvantage that the base current of npn bipolar transistor cannot be reduced sufficiently. Thereby, such a problem arises that the thyristor operation of npn bipolar transistor cannot be turned off in an intended manner. Meanwhile, if the resistance value of resistance 17 is set to, e.g., 0 V, the maximum controllable current increases because a large hole current flows from p-diffusion region 4 to p-diffusion region 6 during the turning off. In this case, however, a large hole current flows from p-diffusion region 6 to cathode electrode 13 in the on state, so that a base current of the npn bipolar transistor disadvantageously decreases. This results in such a problem that a holding current in the thyristor operation increases.

In the conventional semiconductor device, if p-channel MOS12 including p-diffusion regions 4 and 6 as well as gate electrode 11 has a small channel length (gate length), a resistance is generated by a JFET effect against n-channel MOS11 including $n^+$-diffusion region 7, $n^-$-SOI layer 2 and gate electrode 11. For this reason, MOS12 actually has a relatively long channel length (gate length) in the conventional device. As a result, MOS12 has a large on-resistance in the prior art, and thus, the maximum controllable current is disadvantageously small.

SUMMARY OF THE INVENTION

An object of the invention is to provide a semiconductor device in which the holding current in the thyristor operation is reduced and the maximum controllable current is increased.

Another object of the invention is to provide a method of using a semiconductor device in which the thyristor operation can be easily turned off.

According to an aspect of the invention, a semiconductor device includes a semiconductor layer, a first impurity region, second and third impurity regions, a fourth impurity region, a fifth impurity region, first and second gate electrodes, an anode electrode, a cathode electrode and a short-circuit electrode. The semiconductor layer has a main surface and is of a first conductivity type. The first impurity region is formed at a predetermined region on the main surface of the semiconductor layer, and is of a second conductivity type. The second and third impurity regions are formed on the main surface of the first impurity region with a predetermined space between each other, and is of the first conductivity type. The fourth impurity region is formed on the main surface of the semiconductor layer with a predetermined space with respect to the first impurity region, and is of the second conductivity type. The fifth impurity region is formed on a region of the main surface of the semiconductor layer located between the first and fourth impurity regions, and is of the second conductivity type. The first gate electrode is formed on a region of the main surface of the first impurity region located between a side end of the second impurity region remote from the third impurity region and the main surface of the semiconductor layer. The second gate electrode is formed on a region of the main surface of the first impurity region located between the second and third impurity regions. The cathode electrode is in contact with the second impurity region. The anode electrode is in contact with the fourth impurity region. The short-circuit electrode is in contact with both the first and third impurity regions. The first and fifth impurity regions are electrically short-circuited. Preferably, the fifth impurity region may be spaced by predetermined distances from the first and fourth impurity regions, and may include a low-concentration impurity region extending on the main surface of the semiconductor layer toward the fourth impurity region. More preferably, the fifth impurity region may include a low-concentration impurity region having a side surface in contact with a side surface of the first impurity region. Preferably, the third impurity regions may be formed at a plurality of positions spaced by a predetermined distance from each other and located at opposite sides of a portion of the first impurity region in a plan view.

According to this semiconductor device, the first gate electrode is formed between the second and third impurity regions on the main surface of the first impurity region, the cathode electrode is formed in contact with the second impurity region, the short-circuit electrode is formed in contact with both the first and third impurity regions, and the first and fifth impurity regions are electrically short-circuited. Therefore, when the semiconductor device is on, the holding current can be reduced to the same level as a pure thyristor by turning off the transistor including the second gate electrode, because the entire hole current in the semiconductor layer forms the base current of the bipolar transistor. When the semiconductor device is off, the hole current in the semiconductor layer and the hole current in the first impurity region are simultaneously pulled out by turning on the transistor including the second gate electrode. Since the transistor including the second gate electrode is formed independently from the transistor including the first gate electrode, the gate length of the transistor including the second gate electrode can be easily reduced. Thereby, the resistance of the turned-on transistor including the second gate electrode decreases, so that the maximum controllable current increases. In the structure where the fifth impurity region includes the low-concentration impurity region formed on the main surface of the semiconductor layer and extending toward the fourth impurity region, the effect of pulling out the hole current by the low-concentration impurity region increases the maximum controllable current. Also in the structure where the fifth impurity region includes the low-concentration impurity region having the side surface in contact with the side surface of the first impurity region, the maximum controllable current further increases. In the structure where the third impurity regions are formed at a plurality of positions spaced by a predetermined distance and located at opposite sides of a portion of the first impurity region in the plan view, the hole current is not required to flow through a region of a high resistance located immediately under the third impurity region when the semiconductor device is turned off. Therefore, the voltage drop caused by the hole current can be small, so that the maximum controllable current can be large.

According to a method of using the semiconductor device of another aspect of the invention, a voltage applied to the first gate electrode is not changed until a predetermined voltage is first applied to the second gate electrode, when the state is to be shifted from the operating state to the stopped state. Subsequently, a voltage of 0 V is applied to the first gate electrode.

In this method of using the semiconductor device, turn-off can be performed while maintaining a state that only a small number of holes flow into a base region of the bipolar transistor, so that the maximum controllable current further increases.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will be described below with reference to the drawings.

Figure 1:
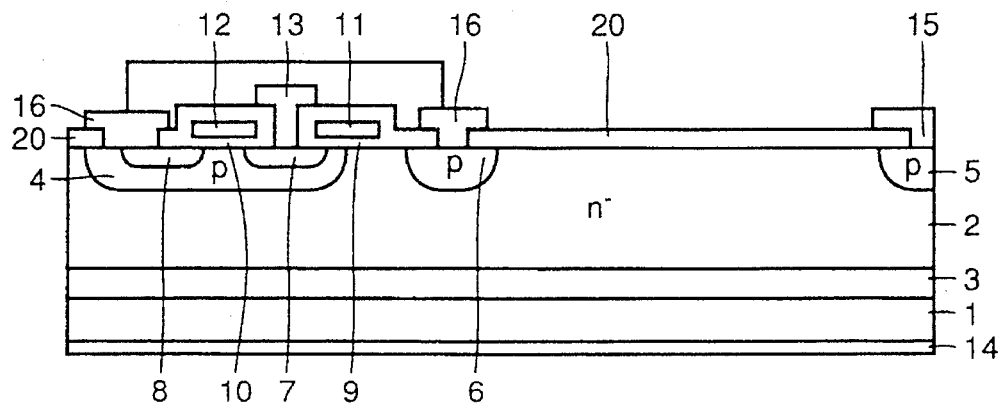
FIG. 1 is a cross section showing a semiconductor device of a first embodiment of the invention.
Figure 2:
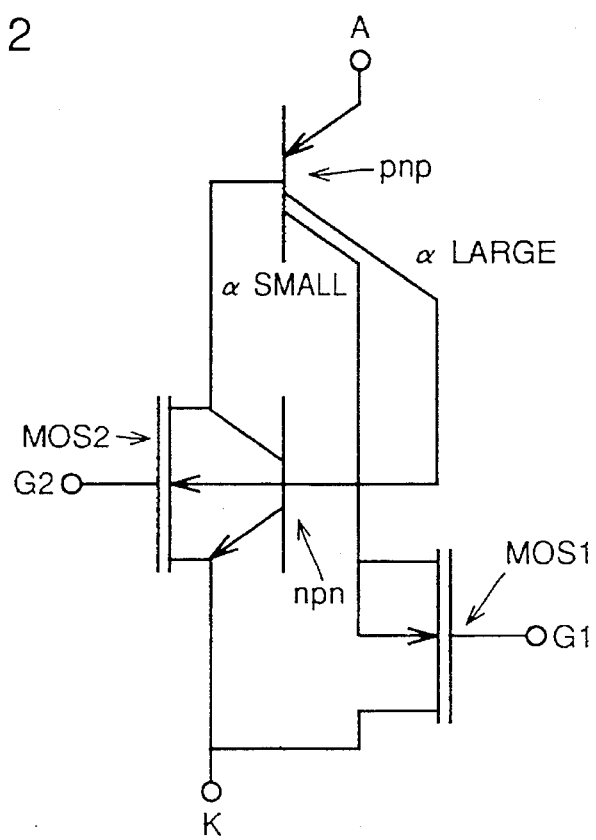
FIG. 2 is an equivalent circuit diagram of the semiconductor device of the first embodiment shown in FIG. 1.

Referring first to FIGS. 1 and 2, a semiconductor device of the first embodiment includes a semiconductor substrate 1 having a main surface on which an insulating film 3 is formed. An $n^-$-SOI layer 2 is formed on insulating film 3. On the main surface of $n^-$-SOI layer 2, there are formed p-diffusion regions 4, 5 and 6 with a predetermined space between each other. On the main surface of p-diffusion region 4, there are formed n⁺-diffusion regions 7 and 8 with a predetermined space between each other. A second gate electrode 12 is formed on p-diffusion region 4 located between n⁺-diffusion regions 7 and 8 with an insulating film 10 therebetween. A first gate electrode 11 is formed on the main surface of p-diffusion region 4 located between n⁺-diffusion region 7 and n⁻-SOI layer 2 with an insulating film 9 therebetween.

The whole surface is covered with an insulating film 20. Contact holes are formed at predetermined regions of insulating film 20. A cathode electrode 13 is in contact with the main surface of n⁺-diffusion region 7. An anode electrode 15 is in contact with the main surface of p-diffusion region 5. A short-circuit electrode 16 is in contact with the main surfaces of p-diffusion region 4 and n⁺-diffusion region 8 as well as the main surface of p-diffusion region 6. An electrode 14 is formed at the rear surface of semiconductor substrate 1.

There is formed an npn bipolar transistor in which n⁺-diffusion region 7 forms an emitter, p-diffusion region 4 forms a base and n⁻-SOI layer 2 forms a collector. There is also formed a pnp bipolar transistor of a multi-collector type in which p-diffusion region 5 forms an emitter, n⁻-SOI layer 2 forms a base and p-diffusion regions 4 and 6 form a collector. Between these collectors of the pnp bipolar transistor, the collector (p-diffusion region 6) near the p-diffusion region 5 forming the emitter has a larger base transport factor α than the other collector (p-diffusion region 4).

There is provided an MOS1 formed of an n-channel MOS transistor, in which n⁺-diffusion region 7 forms a source region, p-diffusion region 4 forms a back gate and n⁻-SOI layer 2 forms a drain region. There is also provided an MOS2 formed of an n-channel MOS transistor, in which n⁺-diffusion region 7 forms a source region, p-diffusion region 4 forms a back gate and n⁺-diffusion region 8 forms a drain region.

Operation of the semiconductor device of the first embodiment shown in FIG. 1 will be described below with reference to FIGS. 3 to 5.

Figure 3:
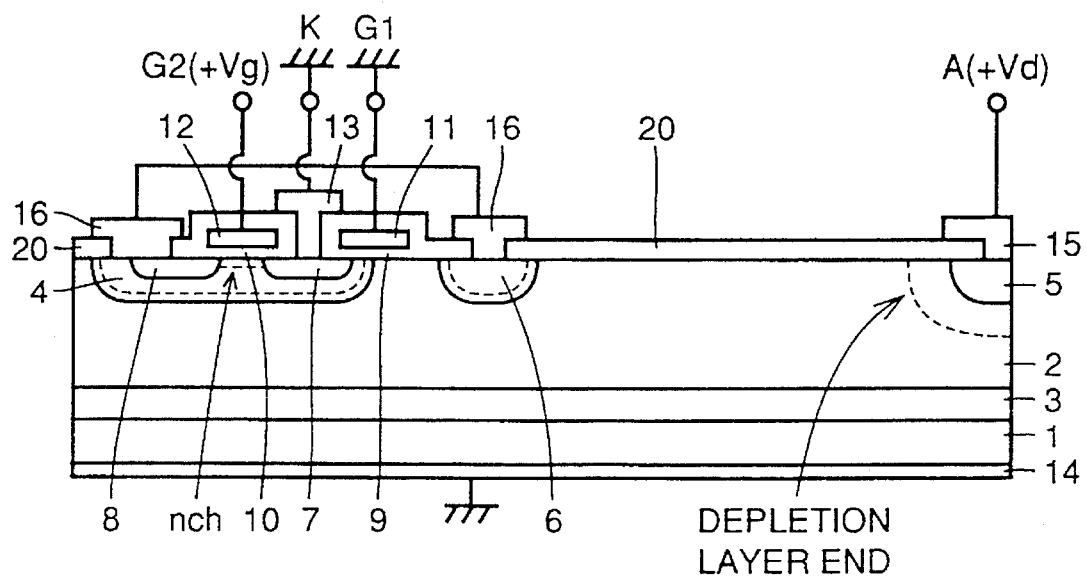
FIGS. 3 to 5 are cross sections showing first to third steps of the operation of the semiconductor device of the first embodiment shown in FIG. 1, respectively.

As shown in FIG. 3, a voltage of 0 V is applied to cathode electrode 13 and electrode 14, a voltage of 0 V is applied to first gate electrode 11, a voltage of +Vg is applied to a second gate electrode 12, and a voltage of Vd is applied to an anode electrode 15. Thereby, the surface of p-diffusion region 4 located under second gate electrode 12 is inverted, so that p-diffusion region 4 and n⁺-diffusion region 7 are short-circuited. Thereby, the semiconductor device is turned off.

Figure 4:
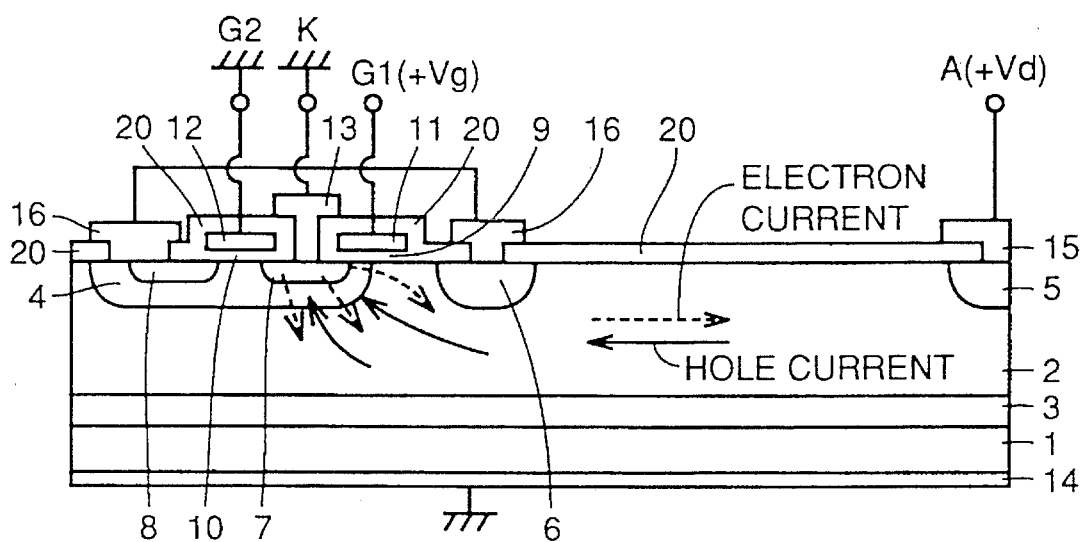

In this state, as shown in FIG. 4, a voltage of 0 V is applied to second gate electrode 12, and a voltage of +Vg is applied to first gate electrode 11, whereby the surface of p-diffusion region 4 located under first gate electrode 11 is inverted into the n-type. Thereby, an electron current flows from n⁺-diffusion region 7 toward n⁻-SOI layer 2. As the electron current flows into p-diffusion region 5, a hole current flows from p-diffusion region 5 into n⁻-SOI layer 2. This hole current forms a base current of the npn bipolar transistor, whereby the thyristor operation is achieved.

Figure 5:
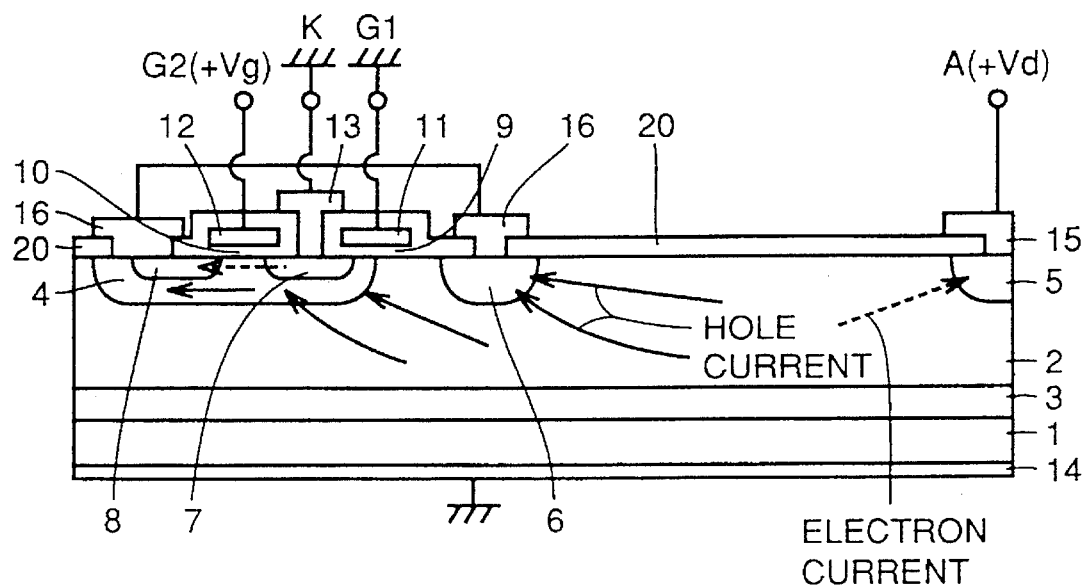

In this state, as shown in FIG. 5, a voltage of 0 V is applied to first gate electrode 11 again, and a voltage of +Vg is applied to second gate electrode 12, so that the surface of p-diffusion region 4 under second gate electrode 12 is inverted into the n-type. Thereby, the hole current flowing into p-diffusion region 4 is bypassed to cathode electrode 13, and the hole current in n⁻-SOI layer 2 is pulled out from p-diffusion region 6. As a result, the base current of the npn transistor can be reduced, and the thyristor operation can be easily turned off.

In this first embodiment, when the thyristor operation is on, the entire hole current in n⁻-SOI layer 2 forms the base current of the npn bipolar transistor. Therefore, the holding current of the thyristor operation can be reduced to the substantially same level as that of the pure thyristor. Meanwhile, when the thyristor operation is off, the hole current in n⁻-SOI layer 2 and the hole current in p-diffusion region 4 can be simultaneously pulled out by turning off MOS1 and turning on MOS2. Since MOS2 is provided independently from MOS1, the channel length (gate length) can be set sufficiently small to reduce the on-resistance in contrast to the prior art. Thereby, the maximum controllable current can be increased.

Figure 6:
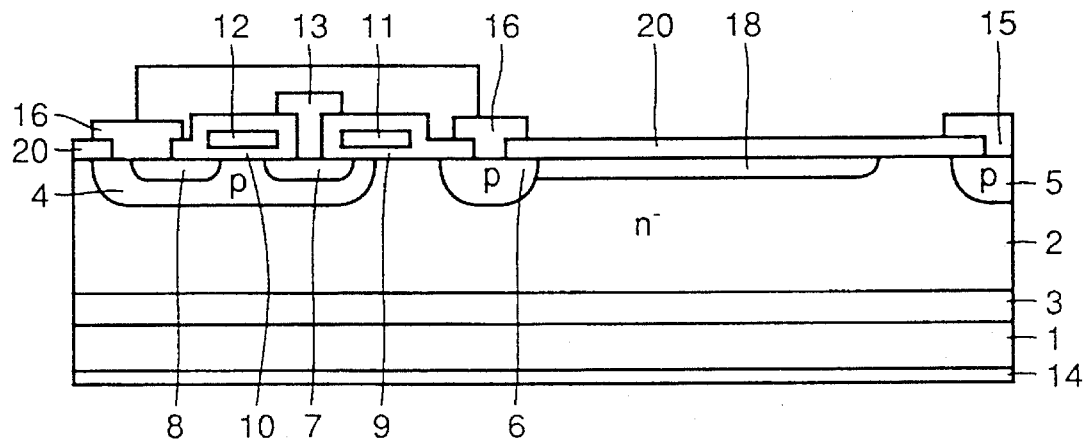
FIG. 6 is a cross section showing a semiconductor device of a second embodiment of the invention.

In a second embodiment, as shown in FIG. 6, a p⁻-diffusion region 18 extending from a side end of p-diffusion region 6 toward p-diffusion region 5 is formed on the main surface of n⁻-SOI layer 2. The second embodiment has the same structure as the first embodiment except for p⁻-diffusion region 18. The equivalent circuit diagram of the second embodiment is the same as that of the first embodiment of FIG. 2 except for that the collector of the pnp bipolar transistor is formed of p-diffusion regions 4 and 6 as well as p⁻-diffusion region 8. In this second embodiment, p⁻-diffusion region 18 forming the collector is arranged at the region near p-diffusion region 5 forming the emitter of the pnp bipolar transistor, whereby the base transport factor α can be larger than that of the first embodiment.

Figure 7:
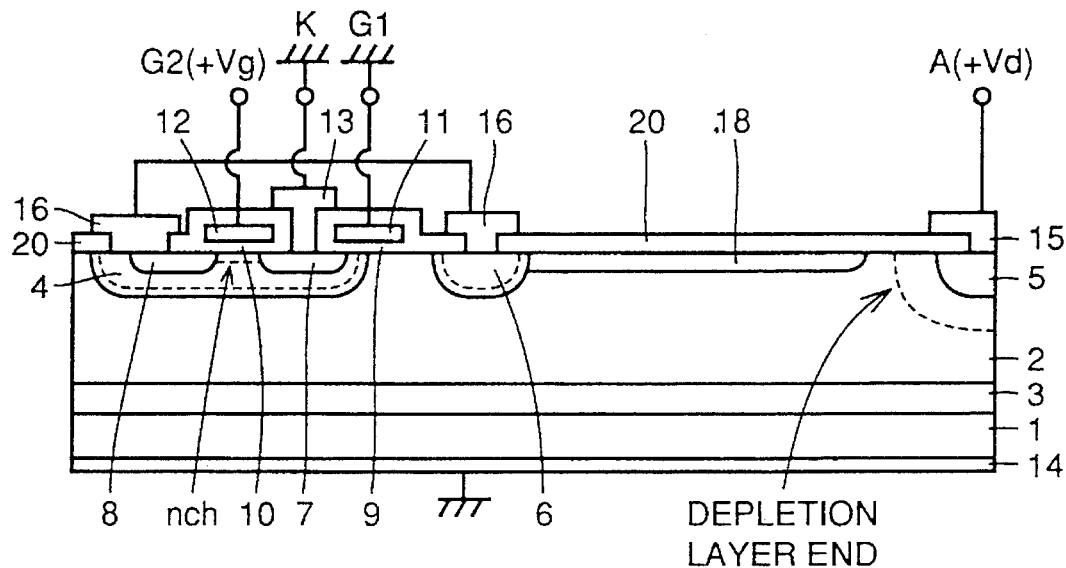
FIGS. 7 and 8 are cross sections showing first and second steps of the operation of the semiconductor device of the second embodiment shown in FIG. 6, respectively.

Operation of the semiconductor device of the second embodiment will be described below with reference to FIGS. 7 and 8. Referring first to FIG. 7, a voltage of 0 V is applied to cathode electrode 13 and electrode 14, a voltage of 0 V is applied to first gate electrode 11, a voltage of +Vg is applied to second gate electrode 12, and a voltage of +Vd is applied to anode electrode 15. Thereby, the surface of p-diffusion region 4 located under second gate electrode 12 is inverted into the n-type, so that p-diffusion region 4 and n⁺-diffusion region 7 are short-circuited. Consequently, the thyristor operation of the semiconductor device is turned off. In this state, p⁻-diffusion region 18 is depleted. Optimum conditions for depleting p⁻-diffusion region 18 can be expressed by the following formula (1) provided that the impurity concentration of p⁻-diffusion region 18 is $N(x)\text{cm}^{-3}$, and p⁻-diffusion region 18 has a thickness of t:

$$5 \times 10^{11} \text{ cm}^{-2} < \int_0^t N(x)dx < 5 \times 10^{12} \text{ cm}^{-2} \qquad (1)$$

In the above state, 0 V is applied to second gate electrode 12, and +Vg is applied to first gate electrode 11, whereby the surface of p-diffusion region 4 located under first gate electrode 11 is inverted into the n-type, although not shown. Thereby, the electron current flows from n⁺-diffusion region 7 toward n⁻-SOI layer 2. As the electron current flows into p-diffusion region 5, the hole current flows from p-diffusion region 5 into n⁻-SOI layer 2. The hole current flowing into n⁻-SOI layer 2 forms the base current of the npn bipolar transistor, so that the on state of thyristor operation is achieved. The operation of turning on the thyristor operation is the same as that in the first embodiment.

Figure 8:
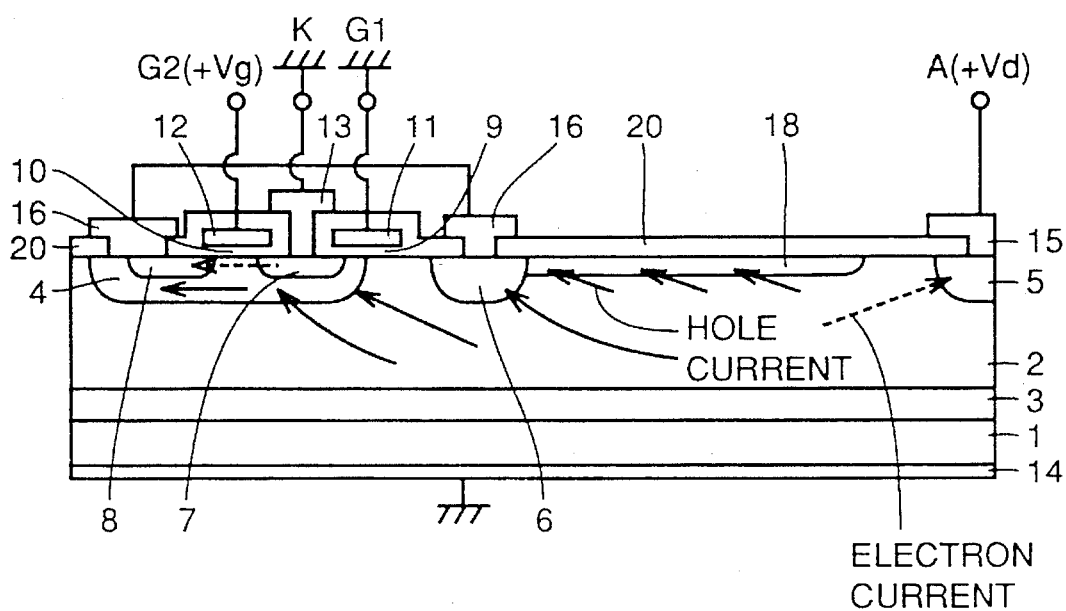

Then, as shown in FIG. 8, a voltage of 0 V is applied to first gate electrode 11, and a voltage of +Vg is applied to second gate electrode 12, so that the surface of p-diffusion region 4 located under second gate electrode 12 is inverted into the n-type. Thereby, the hole current flowing into p-diffusion region 4 is bypassed to cathode electrode 13, and the hole current in n⁻-SOI layer 2 is pulled out from p-diffusion region 6. Thereby, the base current of the npn bipolar transistor decreases, and thus the thyristor operation is turned off. In this second embodiment, the effect of pulling out the hole current from p⁻-diffusion region 18 can achieve the base transport factor α larger than that in the first embodiment, and consequently, the maximum controllable current can be larger than that in the first embodiment.

Figure 9:
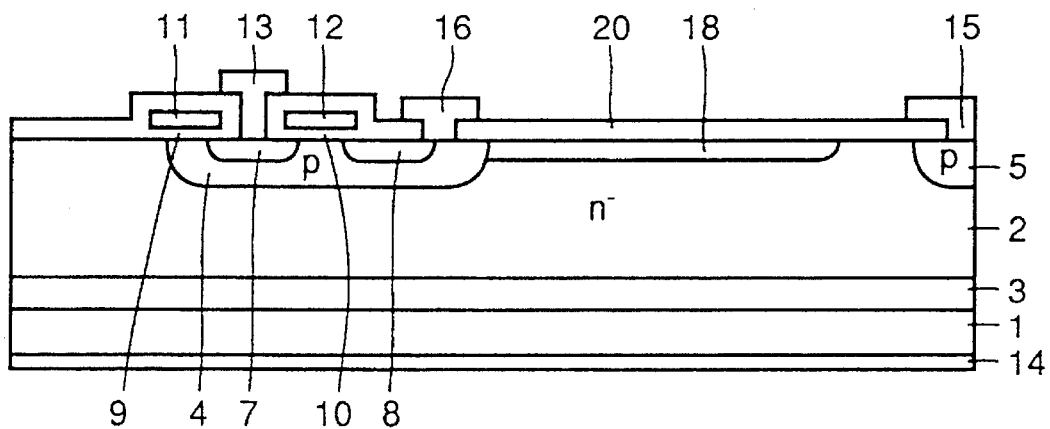
FIG. 9 is a cross section showing a semiconductor device of a third embodiment of the invention.

Referring to FIG. 9, a third embodiment differs from the first and second embodiments already described in that n⁺-diffusion region 7 is located on a left portion of the main surface of p-diffusion region 4, and n⁺-diffusion region 8 is located on a right portion thereof. Further, the third embodiment is not provided with p-diffusion region 6 which is provided in the first and second embodiments. An end of p⁻-diffusion region 18 is in contact with p-diffusion region 4. This third embodiment also differs from the first and second embodiments in that first gate electrode 11 is formed above the left end of p-diffusion region 4. This third embodiment further differs from the first and second embodiments in that short-circuit electrode 16 is in contact with only the two regions, i.e., n⁺-diffusion region 8 and p-diffusion region 4.

The equivalent circuit diagram of the third embodiment is the same as those of the first and second embodiments. However, in this third embodiment, the pnp bipolar transistor is a bipolar transistor of a multi-collector type, in which p-diffusion region 5 forms an emitter, n⁻-SOI layer 2 forms a base, and p-diffusion region 4 and p⁻-diffusion region 18 form collectors. Between these two collectors, the collector (p⁻-diffusion region 18) nearer to p-diffusion region 5 forming the emitter has a larger base transport factor α than the other. Further, in this third embodiment, since first gate electrode 11 is arranged at the left side, p⁻-diffusion region 18 can be in direct contact with p-diffusion region 4 without employing p-diffusion region 6 which is employed in the first and second embodiments. Thereby, the device area can be advantageously smaller than that of the second embodiment.

Figure 10:
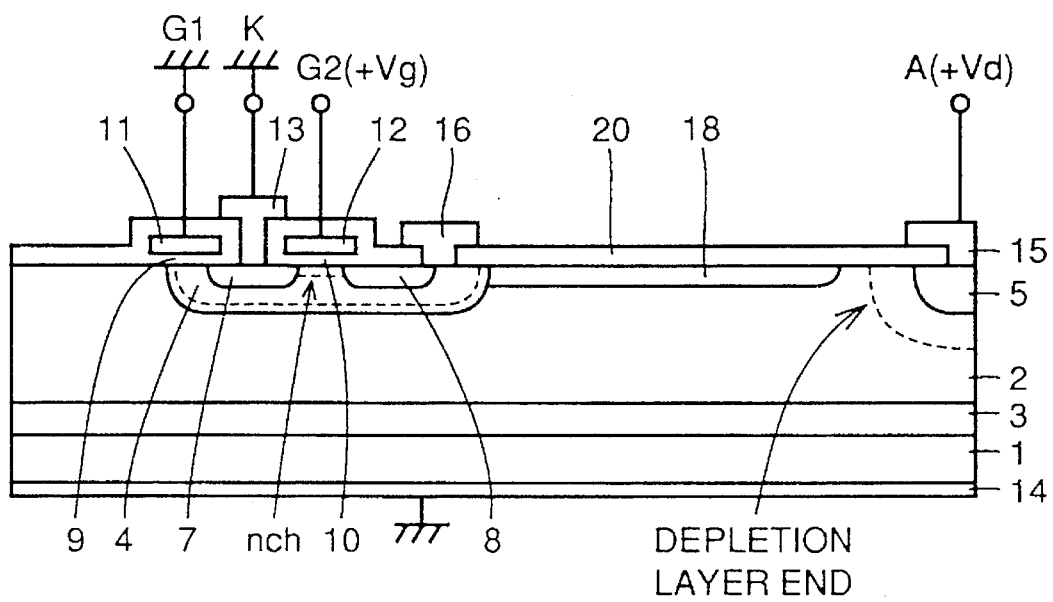
FIGS. 10 and 11 are cross sections showing first and second steps of the operation of the semiconductor device of the third embodiment shown in FIG. 9, respectively.
Figure 11:
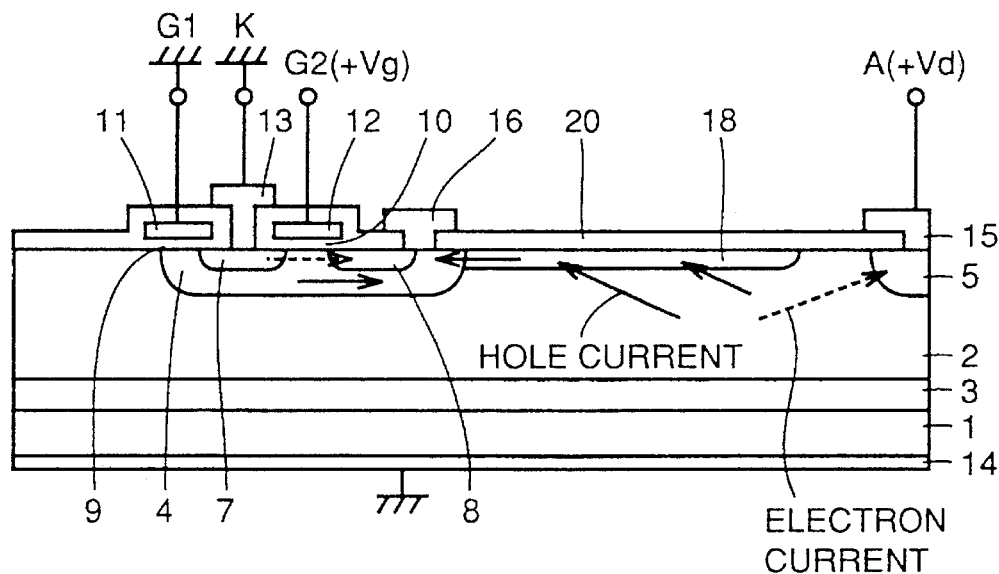

Referring to FIGS. 10 and 11, operation of the semiconductor device of the third embodiment will be described below. As shown in FIG. 10, a voltage of 0 V is applied to cathode electrode 13 and electrode 14, a voltage of 0 V is applied to first gate electrode 11, a voltage of +Vg is applied to a second gate electrode 12, and a voltage of +Vd is applied to anode electrode 15. Thereby, the surface of p-diffusion region 4 located under second gate electrode 12 is inverted into the n-type, and p-diffusion region 4 and n⁺-diffusion region 7 are short-circuited together. Thereby, the semiconductor device is turned off. In this state, p⁻-diffusion region 18 is depleted. The optimum conditions for this depletion are expressed by the aforementioned formula (1). In this state, a voltage of 0 V is applied to second gate electrode 12, and a voltage of +Vg is applied to first gate electrode 11, so that the surface of p-diffusion region 4 located under first gate electrode 11 is inverted into the n-type. Thereby, the electron current flows from n⁺-diffusion region 7 toward n⁻-SOI layer 2. As the electron current flows into p-diffusion region 5, the hole current flows from p-diffusion region 5 into n⁻-SOI layer 2. The hole current thus flowed forms the base current of the npn bipolar transistor, so that the thyristor operation is turned on. The operation of turning on the thyristor operation is the same as that of the first embodiment.

Thereafter, as shown in FIG. 11, a voltage of 0 V is applied to first gate electrode 11, and a voltage of +Vg is applied to second gate electrode 12, so that the surface of diffusion region 4 under second gate electrode 12 is inverted into the n-type. Thereby, the hole current flowed into p-diffusion region 4 is bypassed to cathode electrode 13, and the hole current in n⁺-SOI layer 2 is pulled out from p⁻-diffusion region 18. As a result, the base current of npn bipolar transistor decreases, and the thyristor operation is turned off. In this third embodiment, similarly to the second embodiment, the effect of pulling out the hole current from p⁻-diffusion region 18 achieves the base transparent factor α larger than that in the first embodiment. Thereby, the maximum controllable current can be larger than that in the first embodiment.

Figure 12:
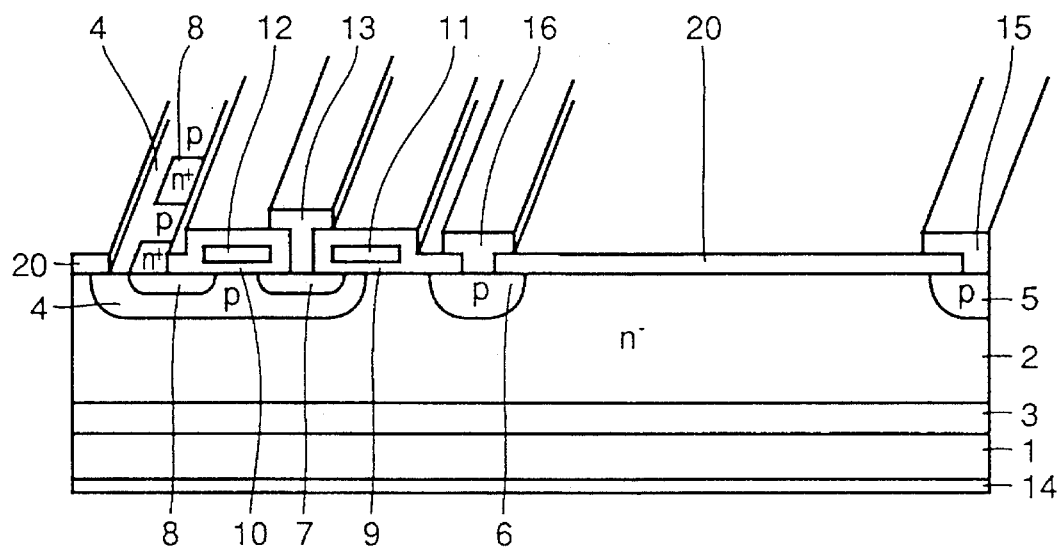
FIG. 12 is a cross section showing a semiconductor device of a fourth embodiment of the invention.
Figure 13:
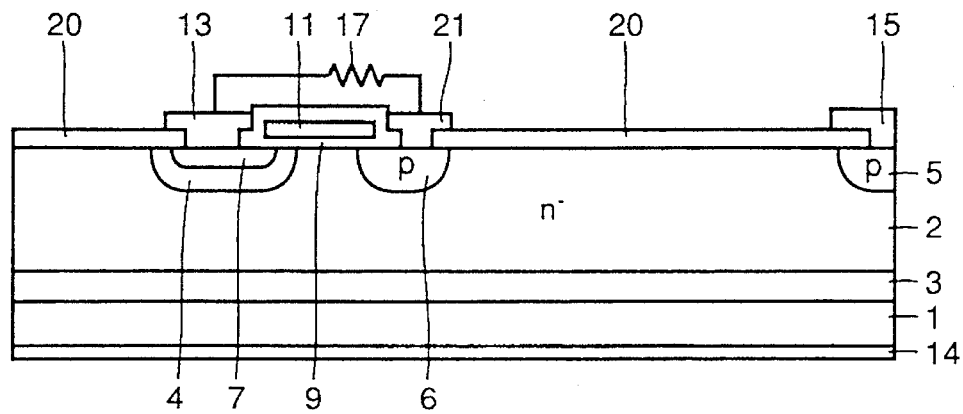
FIG. 13 is a cross section showing a conventional semiconductor device.
Figure 14:
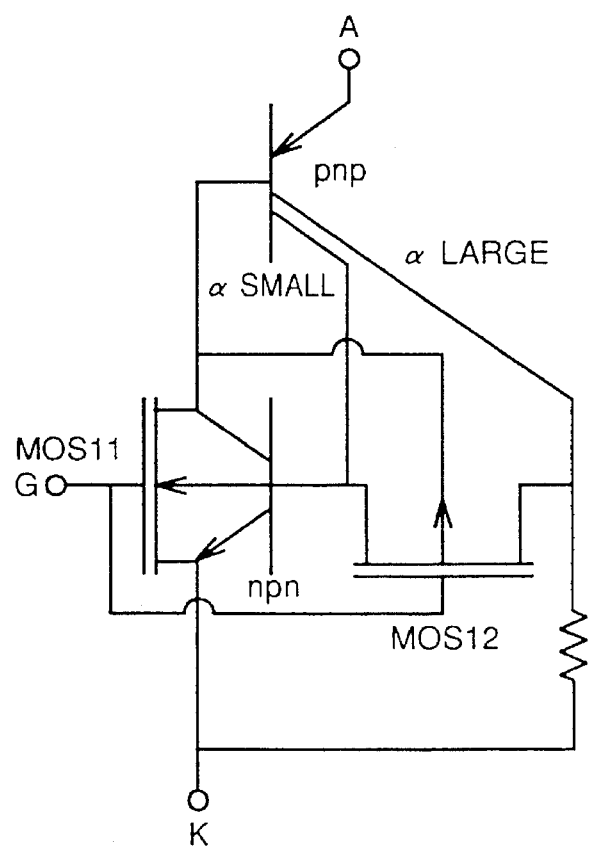
FIG. 14 is an equivalent circuit diagram of the conventional semiconductor device shown in FIG. 13.
Figure 15:
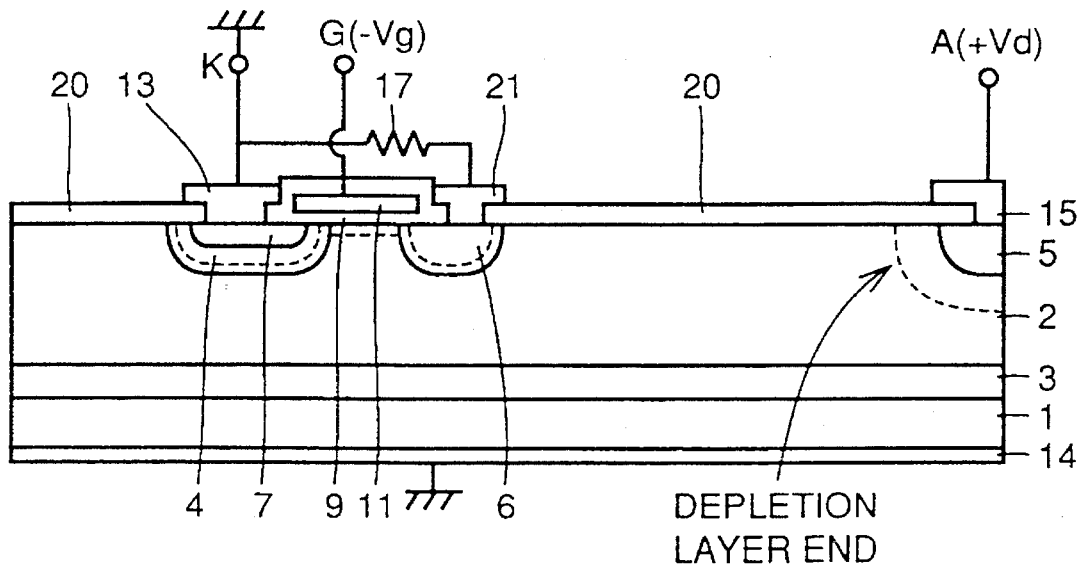
FIGS. 15 to 17 are cross sections showing first to third steps of the operation of the conventional semiconductor device shown in FIG. 13.
Figure 16:
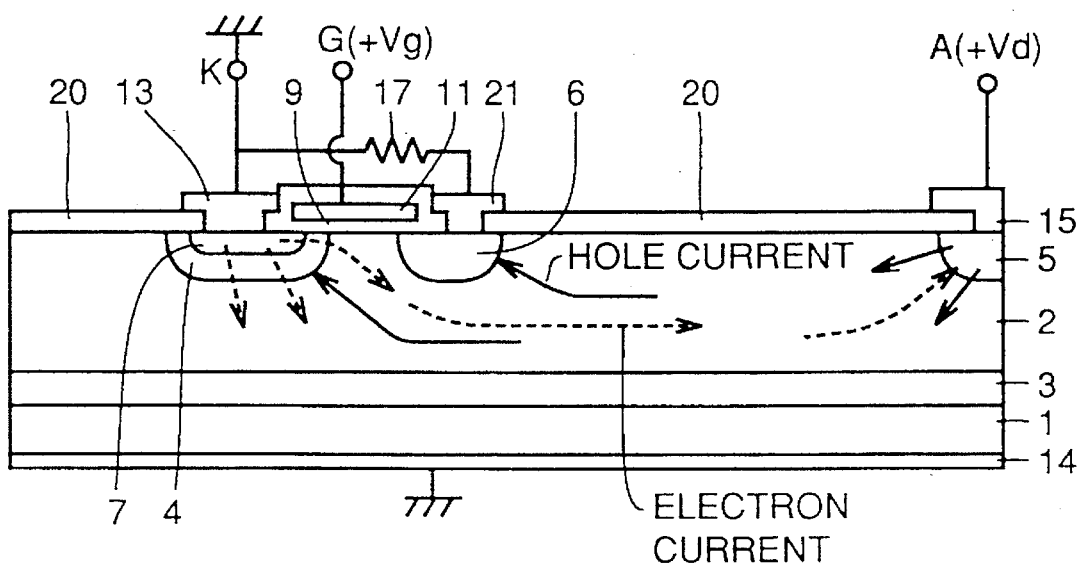
Figure 17:
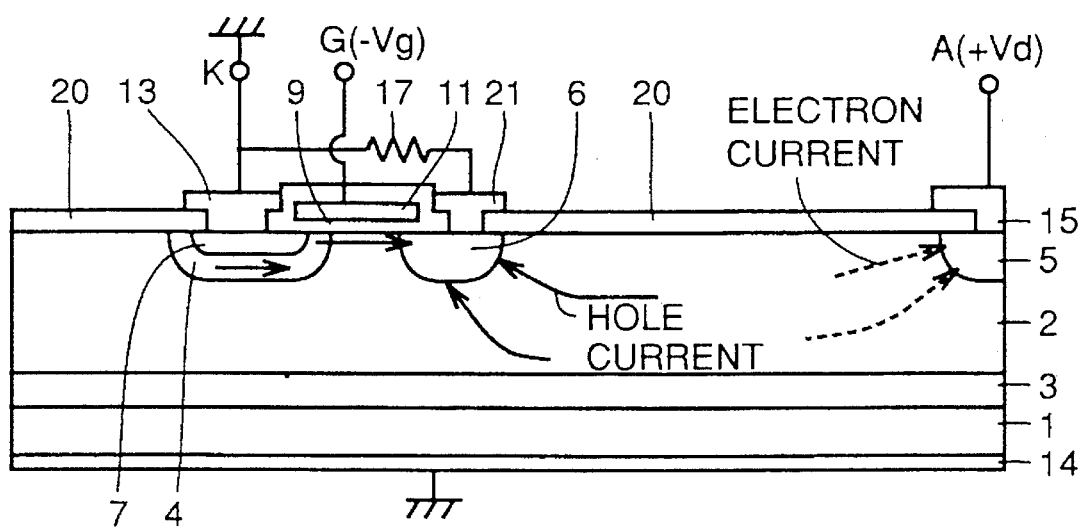

Referring to FIG. 12, a fourth embodiment is provided with a plurality of n⁺-diffusion regions 8 which are formed at positions spaced from each other and are located at opposite sides of a portion of p-diffusion region 4 in a plan view. This structure can achieve the following effect. When turning off the thyristor operation, the hole current may flow through portions of p-diffusion region 4 located immediately under diffusion regions 7 and 8, i.e., portions having a high resistance. Therefore, the voltage drop due to the high resistance of these portions may cause forward bias between p-diffusion region 4 and n⁺-diffusion region 7, which results in such a problem that the thyristor operation cannot be stopped. In the structure of the fourth embodiment, however, the hole current does not flow through the portion immediately under the n⁺-diffusion region, and can flow through the portion of p-diffusion region 4 located between adjacent n⁺-diffusion regions 8. Thereby, the voltage drop can be small, and thus it is possible to prevent such a disadvantage that the thyristor operation cannot be stopped. It should be noted that the structure of the fourth embodiment may be applied to the second and third embodiments.

A fifth embodiment will now be described below. In the fifth embodiment, the turn-off method in the first embodiment already described is improved. More specifically, according to the turn-off method in the first embodiment, the thyristor operation continues immediately before the turn-off. Therefore, if the concentration of holes in n⁻-SOI layer 2 is excessively high in the on state of the thyristor operation, a large voltage drop is caused when the hole current flows through p-diffusion region 4 at the time of turn-off. Thereby, a forward bias is applied across the base and emitter of npn bipolar transistor, so that turn-off cannot be performed. In order to prevent this disadvantage, the voltage applied to second gate electrode 12 is first set to +Vg at the time of turn-off in the fifth embodiment. At this time, the base and emitter of npn bipolar transistor are short-circuited, so that the thyristor operation stops, and operation is performed only by MOS1 and the pnp bipolar transistor. Thereby, the concentration of holes in n⁻-SOI layer 2 decreases. Thereafter, the voltage of first gate electrode 11 is set to 0 V, whereby turn-off is allowed in such a state that a reduced number of holes flow into the base region of npn bipolar transistor. Consequently, the maximum controllable current can be increased.

According to the semiconductor device of one aspect of the invention, the second gate electrode is formed between the second and third impurity regions formed on the first impurity region with a predetermined space between each other, the cathode electrode is formed in contact with the second impurity region, the short-circuit electrode is formed in contact with both the third and first impurity regions, the first and fifth impurity regions are electrically short-circuited together, and the transistor including the second gate electrode is turned on in the on state of the thyristor operation so that the entire hole current in the semiconductor layer forms the base current of the bipolar transistor. Thereby, the holding current of the thyristor operation can be reduced to the substantially same level as that of the pure thyristor. Meanwhile, in the turned-off state of the thyristor operation, the transistor including the first gate electrode is turned off, and the transistor including the second gate electrode is turned on, so that the holes in the first impurity region and the holes in the semiconductor layer can be simultaneously pulled out while maintaining the state that the first and second impurity regions are short-circuited together. Since the second gate electrode is formed independently from the first gate electrode, the channel length (gate length) of the second gate electrode can be easily reduced, and the on-resistance of the transistor including the second gate electrode can be reduced, so that the maximum controllable current can be increased. As described above, the invention can provide the semiconductor device having such characteristics that the maximum controllable current is large and the holding current is small. The fifth impurity region may include the low impurity concentration region which extends on the main surface of the semiconductor layer toward the fourth impurity region, in which case the bipolar transistor using the low impurity concentration region as the collector can have a large base transport efficiency, so that the maximum controllable current can be further increased. The fifth impurity region may have the low impurity concentration region having a side surface which is in contact with a side surface of the first impurity region and extends on the main surface of the semiconductor layer toward the fourth impurity region, in which case the maximum controllable current can be further increased. In the plan view, the third impurity regions may be formed at a plurality of positions spaced by a predetermined distance and located at opposite sides of a portion of the first impurity region, in which case it is not necessary to flow the hole current through the high resistance region under the third impurity region during turn-off, so that the voltage drop caused by the hole current can be reduced, and consequently the maximum controllable current can be increased.

In the method of using the semiconductor device according to another aspect of the invention, a predetermined voltage is first applied to the second gate electrode without changing the voltage applied to the first gate electrode when the operation is to be changed from the operating state to the stopped state, so that the manner of operation changes such that the operation is performed only by the transistor including the first gate electrode and one of the bipolar transistors, and thus the hole concentration of the semiconductor layer decreases. By subsequently applying the voltage of 0 V to the first gate electrode, turn-off is allowed in such a state that only a small number of holes flow into the base region of the other bipolar transistor, so that the maximum controllable current can be further increased.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:

a semiconductor layer of a first conductivity type having a main surface;

a first impurity region of a second conductivity type formed at a predetermined region on said main surface of said semiconductor layer;

second and third impurity regions of the first conductivity type formed on said main surface of said first impurity region with a predetermined space between each other;

a fourth impurity region of the second conductivity type formed on said main surface of said semiconductor layer with a predetermined space with respect to said first impurity region;

a fifth impurity region of the second conductivity type formed on a region of said main surface of said semiconductor layer located between said first and fourth impurity regions;

a first gate electrode formed on a region of said main surface of said first impurity region located between a side end of said second impurity region remote from said third impurity region and said main surface of said semiconductor layer;

a second gate electrode formed on a region of said main surface of said first impurity region located between said second and third impurity regions;

a cathode electrode formed in contact with said second impurity region;

an anode electrode formed in contact with said fourth impurity region; and a short-circuit electrode formed in contact with both said first and third impurity regions, wherein said first and fifth impurity regions are electrically short-circuited.

2. A semiconductor device according to claim 1, wherein said short-circuit electrode is in contact with said fifth impurity region.

3. A semiconductor device according to claim 1, wherein said semiconductor layer is formed on an insulating layer.

4. A semiconductor device according to claim 1, wherein said fifth impurity region is spaced by predetermined distances from said first and fourth impurity regions, and said fifth impurity region includes a low-concentration impurity region extending on said main surface of said semiconductor layer toward said fourth impurity region.

5. A semiconductor device according to claim 4, wherein an impurity concentration $N(x)\text{cm}^{-3}$ of said low-concentration impurity region is in a range expressed by the following formula where t represents a thickness of said low-concentration impurity region:

$$5 \times 10^{11} \text{ cm}^{-2} < \int_0^t N(x)dx < 5 \times 10^{12} \text{ cm}^{-2}.$$

6. A semiconductor device according to claim 1, wherein said fifth impurity region includes a low-concentration impurity region having a side surface in contact with a side surface of said first impurity region and extending on said main surface of said semiconductor layer toward said fourth impurity region.

7. A semiconductor device according to claim 6, wherein an impurity concentration $N(x)\text{cm}^{-3}$ of said low-concentration impurity region is in a range expressed by the following formula where t represents a thickness of said low-concentration impurity region:

$$5 \times 10^{11} \text{ cm}^{-2} < \int_0^t N(x)dx < 5 \times 10^{12} \text{ cm}^{-2}.$$

8. A semiconductor device according to claim 6, wherein said low-concentration impurity region has a junction depth shallower than that of said first impurity region.

9. A semiconductor device according to claim 6, wherein said short-circuit electrode is formed in contact with a region of said first impurity region near said fifth impurity region, and said first gate electrode is formed on a region of said first impurity region remote from said fifth impurity region.

10. A semiconductor device according to claim 1, wherein said first gate electrode is formed on an end of said first impurity region near said fifth impurity region.

11. A semiconductor device according to claim 1, wherein said third impurity region is formed at a plurality of positions spaced by a predetermined distance from each other and located at opposite sides of a portion of said first impurity region in a plan view.

12. A method of using the semiconductor device according to claim 1, wherein the method of using said semiconductor device includes the steps of:

applying a predetermined voltage to said second gate electrode without changing a voltage applied to said first gate electrode when the state is to be shifted from the operating state to the stopped state; and subsequently applying a voltage of 0 V to said first gate electrode.

\* \* \* \* \*

UNITED STATES PATENT AND TRADEMARK OFFICE
CERTIFICATE OF CORRECTION

PATENT NO. : 5,497,011
DATED : March 5, 1996
INVENTOR(S) : Tomohide TERASHIMA

It is certified that error appears in the above-indentified patent and that said Letters Patent is hereby corrected as shown below:

On the title page and column 1, lines 1-2 the title should read as follows:

--SEMICONDUCTOR DEVICE AND METHOD OF USING THE SAME--.

Signed and Sealed this

Twenty-fourth Day of September, 1996

Attest:

BRUCE LEHMAN

Attesting Officer     Commissioner of Patents and Trademarks